(12) United States Patent
Lee

(10) Patent No.: US 7,420,865 B2
(45) Date of Patent: Sep. 2, 2008

(54) PIPE LATCH CIRCUIT FOR INCREASING DATA OUTPUT SPEED, A SEMICONDUCTOR MEMORY DEVICE WITH THE PIPE LATCH CIRCUIT AND DATA OUTPUT OPERATION METHOD OF THE SAME

(75) Inventor: Kang Youl Lee, Chungbuk (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 115 days.

(21) Appl. No.: 11/488,014

(22) Filed: Jul. 18, 2006

(65) Prior Publication Data
US 2007/0223287 A1 Sep. 27, 2007

(30) Foreign Application Priority Data
Mar. 22, 2006 (KR) .................. 10-2006-0026098

(51) Int. Cl.
*G11C 7/00* (2006.01)
(52) U.S. Cl. .................. 365/219; 365/189.05; 365/233
(58) Field of Classification Search .................. 365/233, 365/236, 219, 220, 221, 189.05
See application file for complete search history.

(56) References Cited

U.S. PATENT DOCUMENTS 5,488,730 A * 1/1996 Brown et al. .................. 712/41
6,687,185 B1 * 2/2004 Keeth et al. .................. 365/233
6,762,974 B1 * 7/2004 Johnson et al. ............. 365/233

FOREIGN PATENT DOCUMENTS

| KR | 1020010004202 | 1/2001 |
|---|---|---|
| KR | 1020040043843 | 5/2004 |
| KR | 1020040059983 | 7/2004 |

OTHER PUBLICATIONS

Notice of Allowance for Korean appl. 10-2006-0026098.

* cited by examiner

*Primary Examiner*—Gene N Auduong
(74) *Attorney, Agent, or Firm*—Lowe Hauptman Ham & Berner LLP

(57) ABSTRACT

A pipe latch circuit for increasing data output speed, a semiconductor memory device with the pipe latch circuit and data output operation method of the same. The pipe latch circuit includes a selection signal generator and a pipe latch unit. The selection signal generator generates input selection signals in response to an input control signal and a first selection control signal. The pipe latch unit inverts pre-fetch data received in parallel through a plurality of GIO (Global Input and Output) lines into serial pipe output data in response to input selection signals, a second selection control signal and output control signals and then outputs them at an output node. The pipe latch unit includes an input selection unit for selectively changing a parallel order of pre-fetch data respectively received through a plurality of GIO lines in response to an input selection signals and then respectively outputting input selection data at a plurality of internal data lines in accordance with the change result. The pipe latch circuit has the advantage of increasing data output speed by reducing an output path of pre-fetch data delivered at GIO lines and thus reducing the change of voltage level of the pre-fetch data.

58 Claims, 7 Drawing Sheets

PIPE LATCH CIRCUIT FOR INCREASING DATA OUTPUT SPEED, A SEMICONDUCTOR MEMORY DEVICE WITH THE PIPE LATCH CIRCUIT AND DATA OUTPUT OPERATION METHOD OF THE SAME

BACKGROUND

1. Field of the Invention

The present invention relates to a pipe latch circuit for increasing data output speed, a semiconductor memory device with the pipe latch circuit and data output operation method of the same that are capable of increasing data output speed by reducing an output path of pre-fetch data delivered at GIO lines and thus reducing the change of voltage level of the pre-fetch data.

2. Discussion of Related Art

In general, a data input/output of a synchronous semiconductor memory device is operated in synchronism with an internal clock signal generated on the basis of an external signal. This synchronous semiconductor memory device includes an SDR (Single Data Rate) SDRAM (Synchronous Dynamic Random Memory), a DDR (Double Data Rate) SDRAM and a DDR2 SDRAM, etc. The DDR2 SDRAM of the devices generally uses a 4 bit pre-fetch scheme. The 4 bit pre-fetch scheme is the method that, in the event that a READ command is once generated inside of a semiconductor memory device, 4 bit data are outputted in parallel from a memory cell array and then the 4 bit data are outputted in serial at an external device through one data input/output pin during 2 clock cycles.

As described above, because multi-bit data are outputted at an external device through one data input/output pin in a multi-bit pre-fetch type of a semiconductor memory device, parallel data outputted from a memory cell array have to be inverted into serial data. Therefore, the multi-bit pre-fetch type of a semiconductor memory device includes a pipe latch circuit for inverting parallel data read from the memory cell array into serial data.

FIG. 1 is a block diagram of conventional pipe latch circuit.

Referred to FIG. 1, the pipe latch circuit 10 includes a pipe input unit 20, a register 30, a first selection unit 40, a second selection unit 50 and a pipe output unit 60.

The pipe input unit 20 includes a plurality of pipe input circuits 21 through 24. The pipe input circuits 21 through 24 output pre-fetch data (EVD0, 0DD0, EVD1, 0DD1) received through GIO (Global Input and Output) lines GIOL0 through GIOL3 at the register 30 in response to an input control signal PPIN. The register 30 includes a plurality of latch circuits 31 through 34. The latch circuits 31 through 34 latch the pre-fetched data (EVD0, 0DD0, EVD1, 0DD1) respectively received from the input circuits 21 through 24, and then respectively outputs the latched data LATD0 through LATD3. The first selection unit 40 includes a plurality of selection circuits 41 through 44. The selection circuit 41 selects one of the latched data LATD0 and LATD1 in response to a selection control signal SOSEB0, and then outputs the selected data PRERD0. The selection circuit 42 selects one of the latched data LATD0 and LATD1 in response to a selection control signal SOSEB0, and then outputs the selected data PREFD0. The selection circuit 43 selects one of the latched data LATD2 and LATD3 in response to a selection control signal SOSEB0, and then outputs the selected data PRERD1. The selection circuit 44 selects one of the latched data LATD2 and LATD3 in response to a selection control signal SOSEB0, and then outputs the selected data PRFRD1.

On the other hand, the second selection unit 50 includes a plurality of selection circuits 51 and 52. The selection circuit 51 selects one of the selected data PRERD0 and PRERD1 in response to a selection control signal S0SEBR, and then outputs the selected data PRD0. The selection circuit 52 selects one of the selected data PREFD0 and PREFD1 in response to a selection control signal S0SEBF, and then outputs the selected data PFD0.

The pipe output unit 60 includes a plurality of pipe output circuits 61 and 62. The pipe output circuit 61 receives the selected data PRD0 from the selection circuit 51 in response to an output control signal POUTR, and then outputs the pipe output data RD0. The pipe output circuit 62 receives the selected data PFD0 from the selection circuit 52 in response to an output control signal POUTF, and then outputs the pipe output data FD0.

As mentioned above in detail, the pre-fetched data (EVD0, 0DD0, EVD1, 0DD1) have to be via 5 terminal devices (namely, the pipe input unit 20, the register 30, the first selection unit 40, the second selection unit 50 and the pipe output unit 60) in order to be outputted as the pipe output data RD0 and FD0 by the pipe latch circuit 10.

Meanwhile, because operation speed of recent semiconductor devices is getting faster and faster, demands on semiconductor memory devices for a high speed operation are increased more and more. However, the structure of the pipe latch circuit 10 including the 5 terminal devices is the restrictive factor on operation speed of a semiconductor memory device.

Additionally, in the pipe latch circuit 10, the latched data LATD0 through LATD3 may be varied (for example, may be reduced) while the latched data LATD0 through LATD3 are outputted via the first and second selection unit 40 and 50. This is the reason that input terminals of the second selection unit 50 are directly connected to output terminals of the first selection unit 40. The following is a detailed description with reference to the voltage variation.

The first and second selection unit 40 and 50 respectively select any one of input signals received through their input terminals in response to a selection control signal, and then output the selected signal itself at their input terminals. That is, the first and second selection unit 40 and 50 do not activate the input signals. Thus, the voltage value of the latched data LATD0 through LATD3 may be varied (for example, be reduced) by parasitic capacitance of the first and second selection unit 40 and 50 while the latched data LATD0 through LATD3 is outputted via the first and second selection unit 40 and 50.

For example, the voltage value of the selected data PRD0 and PFD0 inputted at the first selection unit 50 may be smaller than one of the latched data LATD0 through LATD3 inputted at the first selection unit 40. In this way, the pipe output unit 60 may output the error of the pipe output data RD0 and FD0 when the voltage value of the latched data LATD0 through LATD3 inputted at the first selection unit 40 is different from one of the selected data PRD0 through PFD0 outputted from the second selection unit 50.

SUMMARY OF THE INVENTION

Accordingly, it is an object of the present invention to provide a pipe latch circuit that is capable of increasing data output speed by including a selection unit operated as a pipe input circuit and reducing an output path of pre-fetch data delivered at GIO lines, and thus reducing the change of voltage level of the pre-fetch data.

It is also an object of the present invention to provide a semiconductor memory device including a pipe latch circuit that is capable of increasing data output speed by including a selection unit operated as a pipe input circuit and reducing an output path of pre-fetch data delivered at GIO lines, and thus reducing the change of voltage level of the pre-fetch data.

It is also an object of the present invention to provide an output operation method of a pipe latch circuit that is capable of increasing data output speed by including a selection unit operated as a pipe input circuit and reducing an output path of pre-fetch data delivered at GIO lines, and thus reducing the change of voltage level of the pre-fetch data.

A pipe latch circuit in accordance with the present invention includes a selection signal generator and a pipe latch unit in a pipe latch circuit of a semiconductor memory device. The selection signal generator generates input selection signals in response to an input control signal and a first selection control signal. The pipe latch unit inverts pre-fetch data received in parallel through a plurality of GIO (Global Input and Output) lines into serial pipe output data in response to input selection signals, a second selection control signal and output control signals, and then outputs them at an output node. In embodiments, the pipe latch unit includes an input selection unit for selectively changing a parallel order of pre-fetch data respectively received through a plurality of GIO lines in response to an input selection signals and then respectively outputting input selection data at a plurality of internal data lines in accordance with the change result.

A semiconductor memory device in accordance with an aspect of the present invention includes pipe latch circuits and a plurality of output drivers. The pipe latch circuits form an output path of a plurality of pre-fetches respectively received through a plurality of GIO lines in case of the READ operation of the semiconductor memory device. The output drivers respectively form a data output path between a plurality of pipe latch circuits and a plurality of input/output pins. In embodiments, the pipe latch circuits respectively include a selection signal generator and a pipe latch unit. The selection signal generator generates an input selection signal in response to an input control signal and a first selection control signal. The pipe latch unit inverts the pre-assigned number of pre-fetch data of the pre-fetch data respectively received in parallel through the pre-assigned number of GIO lines of the GIO lines into a serial pipe output data in response to input selection signals, a second selection control signal and output control signals, and then outputting the serial pipe output data at one of the output drivers through an output node. In embodiments, the pipe latch unit includes an input selection unit for selectively changing a parallel order of the pre-assigned number of pre-fetch data respectively received through the pre-assigned number of GIO lines in response to input selection signals, and then respectively outputting input selection data at the pre-assigned number of internal data lines in accordance with the change result.

In addition, a semiconductor memory device in accordance with another aspect of the present invention comprises a selection signal generator, a plurality of pipe latch units and a plurality of output drivers. The selection signal generator generates an input selection signal in response to an input control signal and a first selection control signal. The pipe latch units form an output path of a plurality of pre-fetch data respectively received through a plurality of GIO lines in response to input selection signals, a second selection control signal and output control signals in case of the READ operation of the semiconductor memory device. The output drivers respectively form a data output path between the pipe latch units and a plurality of input/output pins in embodiments, the pipe latch units respectively invert the pre-assigned number of pre-fetch data of the pre-fetch data respectively received in parallel through the pre-assigned number of GIO lines of the GIO lines into a serial pipe output data, and then output the serial pipe output data at one of the output drivers through an output node. In addition, the pipe latch units respectively include an input selection unit for selectively changing a parallel order of the pre-assigned number of pre-fetch data respectively received through the pre-assigned number of GIO lines in response to input selection signals and then respectively outputting input selection data at the pre-assigned number of internal data lines in accordance with the change result.

Moreover, a data output operation method of a pipe latch circuit in accordance with a first aspect of the present invention comprises the steps of: generating input selection signals in response to an input control signal and a first selection control signal; selectively changing the parallel order of the pre-fetches respectively received through the GIO lines in response to the input selection signals and then respectively outputting input selection data to a plurality of internal data lines in accordance with the change result; latching the input selection data and then outputting latch data; selecting some of the latch data in response to a second selection control signal and then outputting output selection data; and outputting serial pipe output data based on the output selection data at an output driver through an output node in response to output control signal.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

Figure 1:
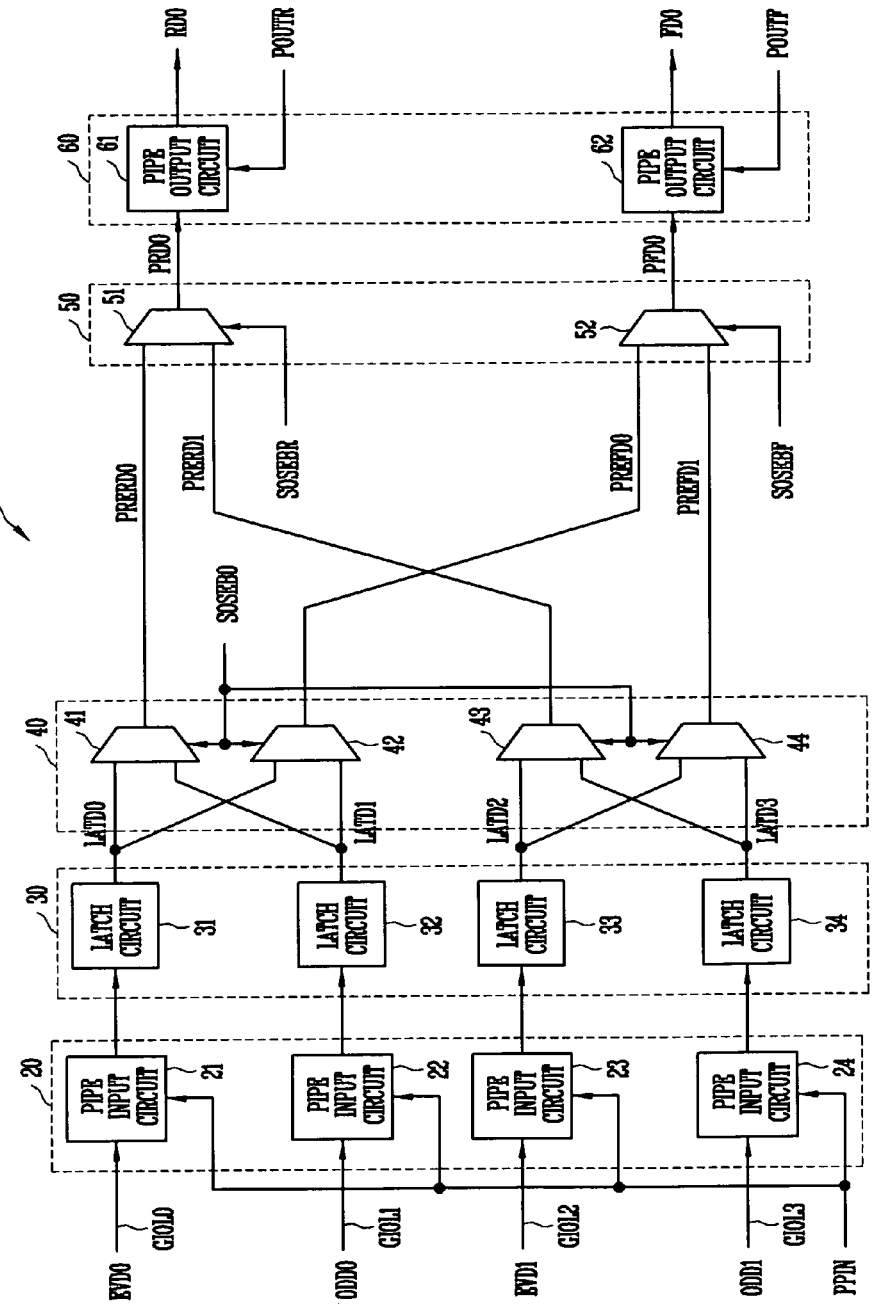
FIG. 1 is a block diagram of conventional pipe latch circuit.

The following examples are given for the purpose of illustration only and are not intended to limit the scope of this invention.

DETAILED DESCRIPTION OF PREFERRED EMBODIMENTS

Hereinafter, embodiments according to the present invention will be described with reference to the accompanying drawings. Here, when one element is connected to another element, one element may be not only directly connected to another element but also indirectly connected to another element via another element. Further, irrelative elements are omitted for clarity. Also, like reference numerals refer to like elements throughout. Details and improved items in accordance with the present invention are disclosed in independent claims.

Figure 2:
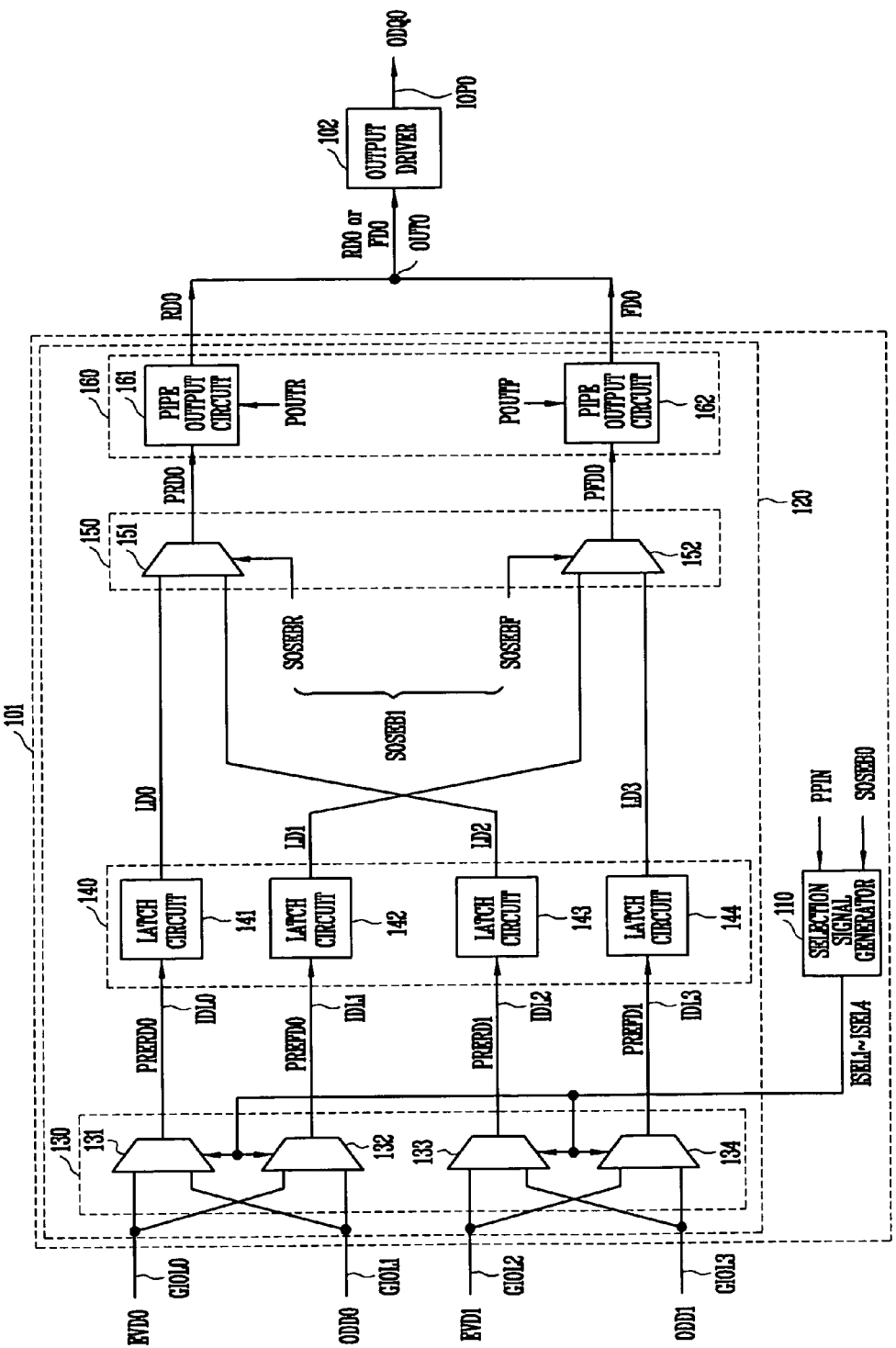
FIG. 2 is a block diagram of a pipe latch circuit and an output driver in accordance with an exemplary embodiment of the present invention.

FIG. 2 is a block diagram of a pipe latch circuit and an output driver in accordance with an exemplary embodiment of the present invention.

Referred to FIG. 2, the pipe latch circuit 101 includes a selection signal generator 110 and a pipe latch unit 120. The selection signal generator 110 outputs input selection signals ISEL1 through ISEL4 in response to an input control signal PPIN and a selection control signal SOSEB0. The selection signal generator 110 generates input selection signals ISEL1 through ISEL4 on the basis of a logic value of the selection control signal SOSEB0 in the event that the input control signal PPIN is enabled, and outputs the input selection signals ISEL1 and ISEL3 as a high logic state and the input selection signals ISEL2 and ISEL4 as a low logic state irrespective of a logic value of the selection control signal SOSEB0 in the event that the input control signal PPIN is disabled. A logic value of the selection control signal SOSEB0 may be decided according to one of an external address signal (for example, column address signal).

Figure 3:
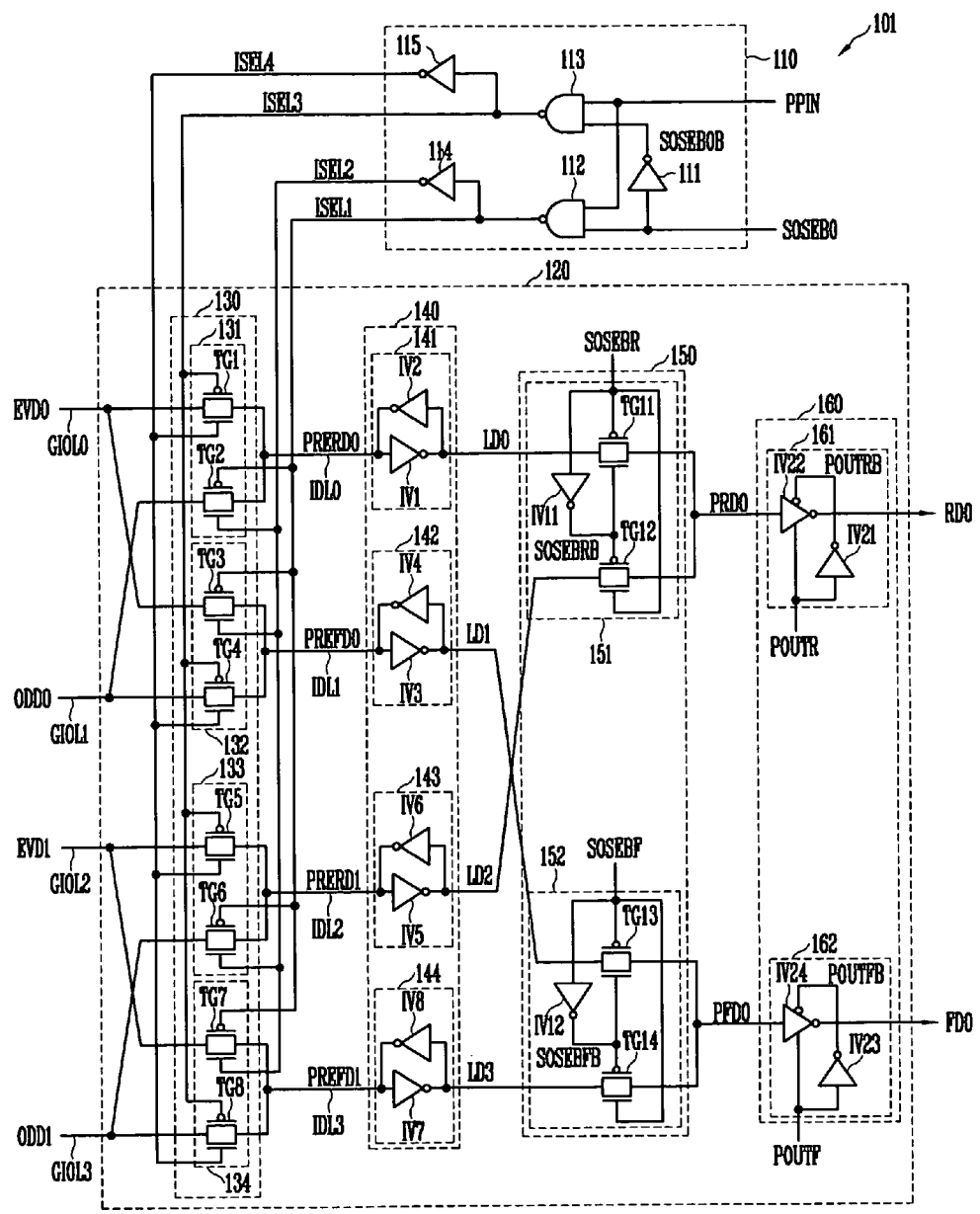
FIG. 3 is a detailed circuit diagram of the pipe latch circuit shown in FIG. 2 in accordance with an exemplary embodiment of the present invention.

The following is a more detailed description of a structure and specific operation of the selection signal generator 110 with reference to FIG. 3. FIG. 3 is a detail circuit diagram of the pipe latch circuit shown in FIG. 2.

The selection signal generator 110 includes inverters (111, 114 and 115) and NAND gates 112 and 113. The inverter 11 inverts the selection control signal SOSEB0, and then outputs an inverted selection control signal SOSEB0B. The NAND gate 112 outputs the input selection signal ISEL1 in response to the input control signal PPIN and the selection control signal SOSEB0. When the input control signal PPIN is enabled, the NAND gate 112 outputs the input selection signal ISEL1 according to a logic value of the selection control signal SOSEB0. For example, when the input control signal PPIN is enabled, the NAND gate 112 outputs the input selection signal ISEL1 as a low logic state if the selection control signal SOSEB0 is a high logic state state, and when the input control signal PPIN is enabled, the NAND gate 112 outputs the input selection signal ISEL1 as a high logic state if the selection control signal SOSEB0 is a low logic state state. The NAND gate 113 outputs the input selection signal ISEL3 in response to the inverted selection control signal SOSEB0B and the input control signal PPIN.

Because an operation of the NAND gate 113 is similar to one of the NAND gate 112, a specific operation explanation will be omitted hereinafter. The inverter 114 inverts the input selection signal ISEL1, and then outputs the inverted signal as the input selection signal ISEL2. The inverter 115 inverts the input selection signal ISEL3, and then outputs the inverted signal as the input selection signal ISEL4. Finally, the input selection signals ISEL2 and ISEL4 become a logic low state in the event that the input selection signals ISEL1 and ISEL3 are a high logic state state.

Additionally referring to FIG. 2, the pipe latch unit 120 includes an input selection unit 130, a latch unit 140, an output selection unit 150 and a pipe output unit 160. The input selection unit 130 selectively changes a parallel order of pre-fetch data (EVD0, 0DD0, EVD1, 0DD1) respectively received through GIO (Global Input and Output) lines GIOL0 through GIOL3 in response to the input selection signals ISEL1 through ISEL4, and then respectively outputs input selection data (PRERD0, PREFD0, PRERD1, PREFD1) at internal data lines IDL0 through IDL3 in accordance with the change result. The following is a detailed description with reference to the procedure.

For example, the input selection unit 130 changes pre-fetch data (PRERD0, PREFD0, PRERD1, PREFD1) into a specific parallel order (0DD0→EVD0→0DD1→EVD1), and can respectively output the changed pre-fetch data (0DD0, EVD0, 0DD1, EVD1) as input selection data (PRERD0, PREFD0, PRERD1, PREFD1). In addition, the input selection unit 130 can respectively output the pre-fetch data (EVD0, 0DD0, EVD1, 0DD1) exactly as input selection data (PRERD0, PREFD0, PRERD1, PREFD1).

The input selection unit 130 includes selection circuits 131 through 134. Preferably, the selection circuits 131 through 134 may be respectively embodied as a multiplexer operated in response to the input selection signals ISEL1 through ISEL4. The selection circuit 131 selects one of the pre-fetch data EVD0 and 0DD0 received through the GIO lines GIOL0 and GIOL1 in response to the input selection signals ISEL1 through ISEL4 and then outputs the selected data EVD0 or 0DD0 at the internal data line IDL0 as the input selection data PRERD0. The selection circuit 132 selects one of the pre-fetch data EVD0 and 0DD0 in response to the input selection signals ISEL1 through ISEL4 and then outputs the selected data 0DD0 or EVD0 at the internal data line IDL1 as the input selection data PREFD0. Preferably, the selection circuits 131 and 132 select separate pre-fetch data. The selection circuits 133 selects one of the pre-fetch data EVD1 and 0DD1 received through the GIO lines GIOL2 and GIOL3 in response to the input selection signals ISEL1 through ISEL4 and then outputting the selected data EVD1 or 0DD1 at the internal data line IDL2 as the input selection data PRERD1. The selection circuits 134 selects one of the pre-fetch data EVD1 and 0DD1 in response to the input selection signals ISEL1 through ISEL4 and then outputting the selected data 0DD1 or EVD1 at the internal data line IDL3 as the input selection data PREFD1. The selection circuits 133 and 134 select separate pre-fetch data.

The following is a more detailed description of a structure and specific operation of the selection circuits 131 through 134 with reference to FIG. 3.

The selection circuit 131 includes switches TG1 and TG2. The switch TG1 is connected between the GIO line GIOL0 and the internal data line IDL0 and is turned on or turned off in response to the input selection signals ISEL3 and ISEL4. When the input selection signal ISEL4 is a high logic state and the input selection signal ISEL3 is a low logic state, the switch TG1 is turned on and thus outputs the pre-fetch data EVD0 at the internal data line IDL0 as the input selection data PREFD0. The switch TG2 is connected between the GIO line GIOL1 and the internal data line IDL0 and is turned on or turned off in response to the input selection signals ISEL1 and ISEL2. When the input selection signal ISEL1 is a low logic state and the input selection signal ISEL2 is a high logic state, the switch TG2 is turned on and thus outputs the pre-fetch data 0DD0 at the internal data line IDL0 as the input selection data PRERD0.

The selection circuit 132 includes switches TG3 and TG4. The switch TG3 is connected between the GIO line GIOL0 and the internal data line IDL1 and is turned on or turned off in response to the input selection signals ISEL1 and ISEL2. When the switch TG2 is turned on, the switch TG3 is turned on and thus outputs the pre-fetch data EVD0 at the internal data line IDL1 as the input selection data PREFD0. The switch TG4 is connected between the GIO line GIOL1 and the internal data line IDL1 and is turned on or turned off in response to the input selection signals ISEL3 and ISEL4. When the switch TG1 is turned on, the switch TG4 is turned on and thus outputs the pre-fetch data 0DD0 at the internal data line IDL1 as the input selection data PRERD0.

The selection circuit 133 includes switches TG5 and TG6. The switch TG5 is connected between the GIO line GIOL2 and the internal data line IDL2 and is turned on or turned off in response to the input selection signals ISEL3 and ISEL4. When the input selection signal ISEL4 is a high logic state and the input selection signal ISEL3 is a low logic state, the switch TG5 is turned on and thus outputs the pre-fetch data EVD1 at the internal data line IDL2 as the input selection data PRERD1. The switch TG6 is connected between the GIO line GIOL3 and the internal data line IDL2 and is turned on or turned off in response to the input selection signals ISEL1 and ISEL2. When the input selection signal ISEL1 is a low logic state and the input selection signal ISEL2 is a high logic state, the switch TG6 is turned on and thus outputs the pre-fetch data 0DD1 at the internal data line IDL2 as the input selection data PRERD1.

The selection circuit 134 includes switches TG7 and TG8. The switch TG7 is connected between the GIO line GIOL2 and the internal data line IDL3 and is turned on or turned off in response to the input selection signals ISEL1 and ISEL2. When the switch TG6 is turned on, the switch TG7 is turned on and thus outputs the pre-fetch data EVD1 at the internal data line IDL3 as the input selection data PREFD1. The switch TG8 is connected between the GIO line GIOL3 and the internal data line IDL3 and is turned on or turned off in response to the input selection signals ISEL3 and ISEL4. When the switch TG5 is turned on, the switch TG8 is turned on and thus outputs the pre-fetch data 0DD1 at the internal data line IDL3 as the input selection data PREFD1. The switches TG1 through TG8 can respectively be embodied as a transmission gate.

Repeatedly referred to FIG. 2, the latch unit 140 includes latch circuits 141 through 144. The latch circuits 141 through 144 latch the input selection data (PRERD0, PREFD0, PRERD1, PREFD1) received through the internal data lines IDL0 through IDL3 and the output the latched data LD0 through LD3. For example, the latch circuit 141 latches the input selection circuit PRERD0, and then outputs the latch data LD0. As depicted in FIG. 3, the latch circuits 141 through 144 include two inverters (IV1 and IV2~IV7 and IV8). For example, the latch circuit 141 includes the inverters IV1 and IV2.

The output selection unit 150 selects some of the latch data LD0 through LD3 and then outputs the output selection data PRD0 and PFD0 in response to the selection control signal S0SEB1. The selection control signal S0SEB1 includes selection signals S0SEBR and S0SEBF. The output selection unit 150 includes selection signals 151 and 152. Preferably, the selection signals 151 and 152 can respectively embodied as a multiplexer operated in response to the selection signals S0SEBR and S0SEBF. The selection circuit 151 selects one of the latch data LD0 and LD2 and then outputs the selected latch data LD0 or LD2 as an output selection data PRD0. The selection circuit 152 selects one of the latch data LD1 and LD3 in response to the selection signal S0SEBF and then outputs the selected latch data LD1 or LD3 as an output selection data PFD0.

The pipe output unit 160 includes pipe output circuits 161 and 162. The pipe output circuit 161 receives the output selection data PRD0 in response to an output control signal POUTR and then outputs a pipe output data RD0 at an output node OUT0 in response to the output selection data PRD0. When the output control signal POUTR is enabled, the pipe output circuit 161 receives the output selection data PRD0 and then outputs the pipe output data RD0 at the output node OUT0.

The pipe output circuit 162 receives the output selection data PFD0 in response to an output control signal POUTF and then outputting a pipe output data RD0 at an output node OUT0 in response to the output selection data PFD0. When the output control signal POUTF is enabled, the pipe output circuit 161 receives the output selection data PFD0 and then outputs the pipe output data FD0 at the output node OUT0. When any one of the output control signals POUTR and POUTF is operated, the others are not operated. Finally, the pipe output circuits 161 and 162 are alternately operated until the parallel pre-fetch data (EVD0, 0DD0, EVD1, 0DD1) are all outputted at the output node OUT0 as the serial pipe output data RD0 and FD0. An output driver 102 is connected to the output node OUT0. The output driver 102 outputs an output data 0DQ0 at an external device (not shown) through a data input/output pin IOP0 in response to the pipe output data RD0 or FD0.

The following is a more detailed description of a structure and specific operation of the selection circuits 151 and 152 and the pipe output circuits 161 and 162 with reference to FIG. 3.

The selection circuit 151 includes an inverter IV11 and switches TG11 and TG12. The inverter IV11 inverts the selection signal S0SEBR and then outputs the inverted selection signal S0SEBRB. The switch TG11 is connected between an output terminal of the latch circuit 141 and an input terminal of the pipe output circuit 161, and is turned on or turned off in response to the selection signal S0SEBR and the inverted selection signal S0SEBRB. When the selection signal S0SEBR is a low logic state, the switch TG11 is turned on and thus outputs the latch data LD0 at the output node OUT0 as the pipe output data RD0. The switch TG12 is connected between an output terminal of the latch circuit 143 and an input terminal of the pipe output circuit 161 and is turned on or turned off in response to the selection signal S0SEBR and the inverted selection signal S0SEBRB. When the selection signal S0SEBR is a high logic state, the switch TG12 is turned on and thus outputs the latch data LD2 at the output node OUT0 as the pipe output data RD0.

The selection circuit 152 includes an inverter IV12 and switches TG13 and TG14. The inverter IV12 inverts the selection signal S0SEBF and then outputs the inverted selection signal S0SEBFB. The switch TG13 is connected between an output terminal of the latch circuit 142 and an input terminal of the pipe output circuit 162 and is turned on or turned off in response to the selection signal S0SEBF and the inverted selection signal S0SEBFB. When the selection signal S0SEBF is a low logic state, the switch TG13 is turned on and thus outputs the latch data LD1 at the output node OUT0 as the pipe output data FD0. The switch TG14 is connected between an output terminal of the latch circuit 144 and an input terminal of the pipe output circuit 162 and is turned on or turned off in response to the selection signal S0SEBF and the inverted selection signal S0SEBFB. When the selection signal S0SEBF is a high logic state, the switch TG14 is turned on and thus outputs the latch data LD3 at the output node OUT0 as the pipe output data FD0. Logic values of the selection signal S0SEBR and S0SEBF may be decided according to ones of address signals (for example, column address signals). The switches TG11 through TG14 may respectively be embodied as a transmission gate.

The pipe output circuit 161 includes inverters IV21 and IV22. The inverter IV21 inverts the output control signal POUTR and then outputs the inverted output control signal POUTRB. The inverter IV22 is enabled or disabled in response to the output control signal POUTR and the inverted output control signal POUTRB. When the output control signal POUTR is enabled, the inverter IV22 is enabled and then outputs the pipe output data RD0 in response to the output selection data PRD0. The pipe output circuit 162 includes inverters IV23 and IV24. The inverter IV23 inverts the output control signal POUTF and then outputs the inverted output control signal POUTFB. The inverter IV24 is enabled or disabled in response to the output control signal POUTF and the inverted output control signal POUTFB. When the output control signal POUTF is enabled, the inverter IV24 is enabled and then outputs the pipe output data FD0 in response to the output selection data PFD0.

Figure 4:
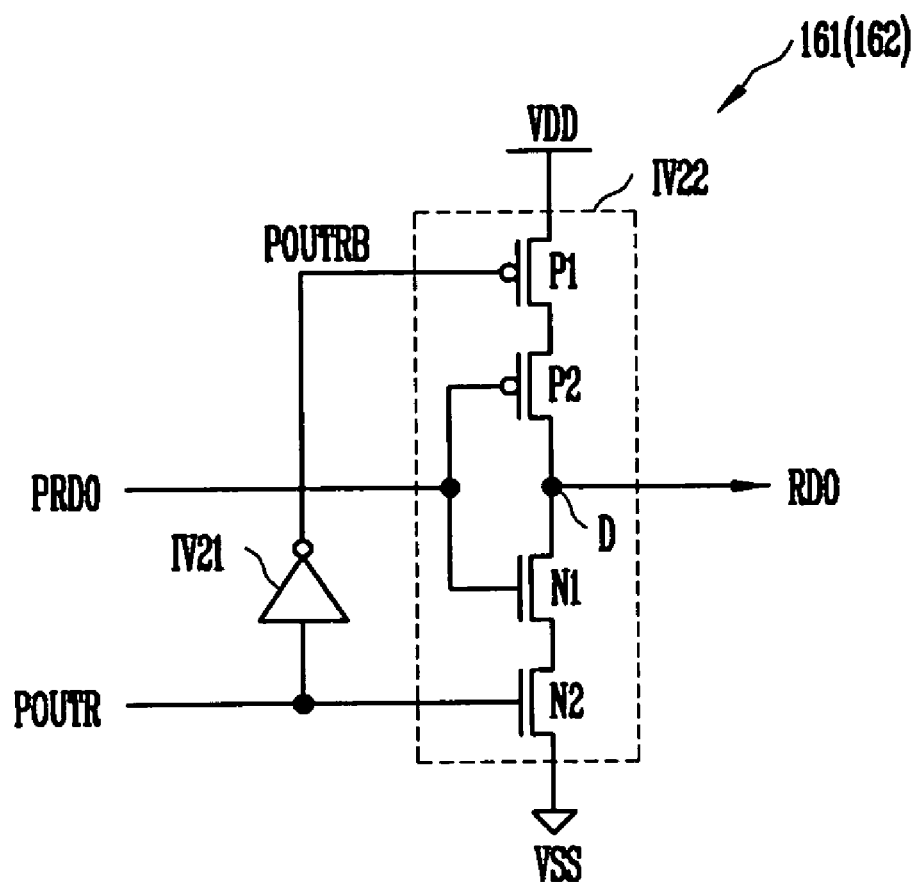
FIG. 4 is a detailed circuit diagram of the pipe output circuit shown in FIG. 3 in accordance with an exemplary embodiment of the present invention.

FIG. 4 is a detail circuit diagram of the pipe output circuit shown in FIG. 3. Because a structure and operation of the pipe output circuit 161 are similar to ones of the pipe output circuit 162, a specific operation of only the pipe output circuit 161 will be mainly explained hereinafter.

The inverter IV22 of the pipe output circuit 161 includes a plurality of PMOS transistors P1 and P2 and a plurality of NMOS transistors N1 and N2. An internal voltage VDD is inputted at a source of the PMOS transistor P1, a drain of the PMOS transistor P1 is connected to a source of the PMOS transistor P2 and the inverted output control signal POUTRB is inputted at a gate of the PMOS transistor P1. The PMOS transistor P1 is turned on or turned off in response to the inverted output control signal POUTRB. A drain of the PMOS transistor P2 is connected to a node D, and the output selection data PRD0 is inputted at a gate of the PMOS transistor P2. The PMOS transistor P2 is turned on or turned off in response to the output selection data PRD0.

A drain of the NMOS transistor N1 is connected to the node D, a source of the NMOS transistor N1 is connected to a drain of the NMOS transistor N2, and the output selection data PRD0 is inputted at a gate of the NMOS transistor N1. The NMOS transistor N1 is turned on or turned off in response to a logic value of the output selection data PRD0. A ground voltage VSS is inputted at a source of the NMOS transistor N2, and the output control signal POUTR is inputted at a gate of the NMOS transistor N2. The NMOS transistor N2 is turned on or turned off in response to the output control signal POUTR.

When the PMOS transistors P1 and P2 are all turned on and the NMOS transistors N1 and N2 are all turned off, the pipe output data RD0 is outputted as a high logic state from the node D. Adversely, when the NMOS transistors N1 and N2 are all turned on and the PMOS transistors P1 and P2 are all turned off, the pipe output data RD0 is outputted as a low logic state from the node D.

As mentioned above in detail, because the input selection unit 130 performs the function of a pipe input circuit in the pipe latch circuit 101, an output path of pre-fetch data can be shortened by 4 terminal devices (namely, the input selection unit 130, the latch unit 140, the output selection unit 150 and the pipe output unit 160). Thus, data output speed of the pipe latch circuit 101 can be increased. In addition, because the latch unit is arranged between the input selection unit 130 and the output selection unit 150, change of voltage level of pre-fetch data can be reduced in the process that the pre-fetch data are via the input latch circuit 101.

Figure 5:
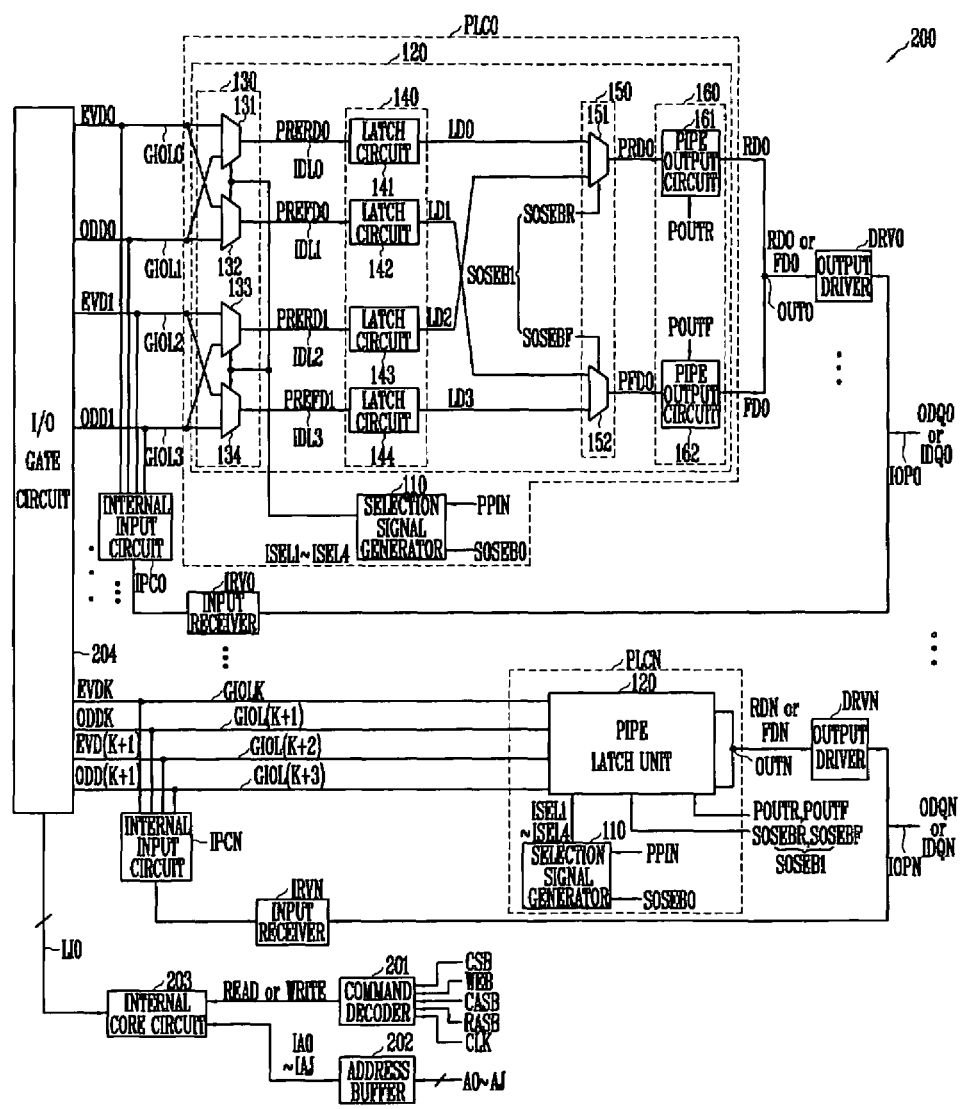
FIG. 5 is a schematic block diagram of a semiconductor memory device and an output driver in accordance with an exemplary embodiment of the present invention.

FIG. 5 is a schematic block diagram of a semiconductor memory device and an output driver in accordance with an exemplary embodiment of the present invention. A pipe latch circuit applied to a semiconductor memory device (for example, DDR2 SDRAM) using 4 bit scheme is shown on FIG. 5.

Referred to FIG. 5, the semiconductor memory device 200 includes a command decoder 201, an address buffer 202, an internal core circuit 203, an input/output gate circuit 204, a plurality of pipe latch circuits PLC0 through PLCN (N is an integer), a plurality of output drivers DRV0 through DRVN, a plurality of input receivers IRV0 through IRVN and a plurality of internal input circuits IPC0 through IPCN. The command decoder 201 outputs a READ or a WRITE command at the internal core circuit 203 in response to external control signals (namely, a chip selection signal CSB, a WRITE enable signal WEB, a column address strobe signal CASB and a row address strobe signal RASB) and an external clock signal CLK. The address buffer 202 receives external address signals A0 through AJ (J is an integer) and then outputs the input address signals IA0 through IAJ at the internal core circuit 203.

The internal core circuit 203, however not depicted on FIG. 5 in detail, includes a memory cell array including a plurality of memory cells and its peripheral circuits. The peripheral circuits include a row decoder, a column decoder, a sense amp circuit and an internal control circuit, etc. The input/output gate circuit 204 is connected between a plurality of GIO lines GIOL0 through GIO(K+3)(K is an integer) and a plurality of LIO (Local Input and Output) lines LIO. The input/output gate circuit 204 respectively outputs a plurality of pre-fetch data (EVD0 through EVDK, 0DD0 through 0DDK) respectively received through the LIO lines LIO at the GIO lines GIOL0 through GIO(K+3) in case of the READ operation of the semiconductor memory device 200. In addition, the input/output gate circuit 204 respectively outputs a plurality of internal input data (not shown) respectively received through a plurality of pre-fetch data (EVD0 through EVDK, 0DD0 through 0DDK) at the LIO lines LIO in case of the WRITE operation of the semiconductor memory device 200. The pipe latch circuits PLC0 through PLCN are connected between the GIO lines GIOL0 through GIO(K+3)(K is an integer) and the output drivers DRV0 through DRVN. The pipe latch circuits PLC0 through PLCN form an output path of a plurality of pre-fetch data (EVD0 through EVDK, 0DD0 through 0DDK) in case of the READ operation of the semiconductor memory device 200.

The pipe latch circuits PLC0 through PLCN respectively include a selection signal generator 110 and a pipe latch unit 120. A structure and specific operation of the selection signal generator 110 and the pipe latch unit 120 is similar to ones of respective devices of FIGS. 2 through 4. In order to avoid the duplication, an explanation of the selection signal generator 110 and thee pipe latch unit 120 will be omitted hereinafter.

The output drivers DRV0 through DRVN are connected between the pipe latch circuits PLC0 through PLCN and the data input/output pins IOP0 through IOPN, and thus form a data output path in case of the READ operation. Specifically speaking, the output drivers DRV0 through DRVN respectively output output data 0DQ0 through ODQN at an external device (not shown) through the data input/output pins IOP0 through IOPN respectively in response to the serial pipe output data (RD0 through RDN and FD0 through FDN) received from the pipe latch circuits PLC0 through PLCN.

The input receivers IRV0 through IRVN respectively receive serial input data IDQ0 through IDQN through the data input/output pins IOP0 through IOPN. The internal circuits IPC0 through IPCN invert the input data IDQ0 through IDQN respectively received from the input receivers IRV0 through IRVN into parallel internal input data (not shown), and then output them at the GIO lines GIOL0 through GIOL(K+3).

Figure 6:
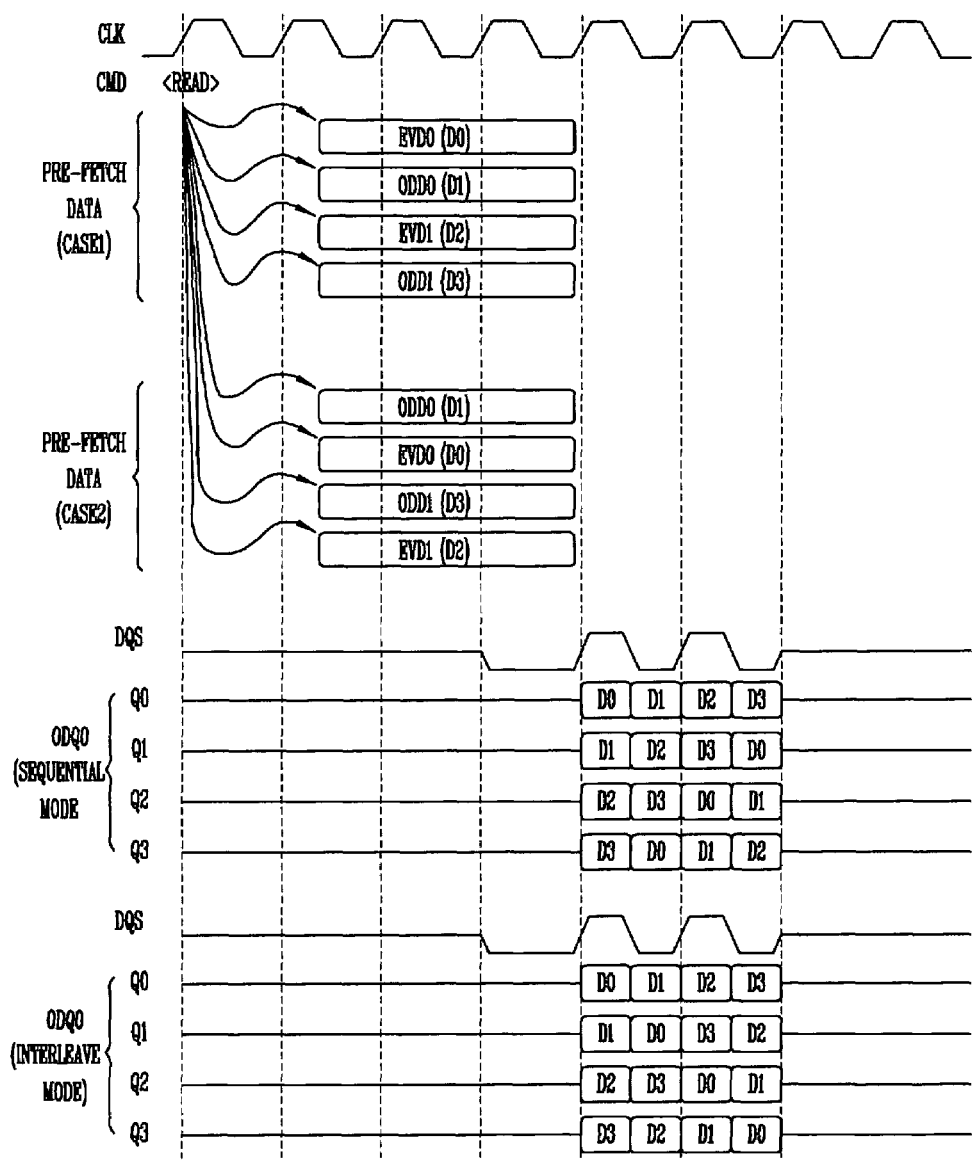
FIG. 6 is a waveform diagram showing the operation of a semiconductor memory device shown on FIG. 5 in accordance with an exemplary embodiment of the present invention.

Next, referred to FIG. 6, the READ operation of the semiconductor memory device 200 will be explained in detail while placing more emphasis on the related part of the present invention.

Only operation procedure of the pipe latch circuit PLC0 connected between the GIO lines CIOL0 through GIOL3 and the output driver DRV0 will be mainly explained because the pipe latch circuits PLC0 through PLCN are all operated alike.

The pipe latch circuit PLC0 is operated as a sequential mode or an interleave mode in response to the selection control signals S0SEB0 and S0SEB1. As shown in FIG. 6, in the event that the pipe latch circuit PLC0 is operated as the sequential mode, the data OQD0 outputted from the output driver DRV0 is different from the output data ODQ0 outputted from the output driver DRV0 operated as the sequential mode.

At first, the following is a READ operation procedure of the semiconductor memory device 200 in the case that the pipe latch circuit PLC0 is operated as the sequential mode.

The command decoder 201 outputs a READ command at the internal core circuit 203 in response to the external clock signal CLK, the chip selection signal CSB, the WRITE enable signal WEB, the column address strobe signal CASB and the row address strobe signal RASB. In addition, the address buffer 202 receives the external address signals A0 through AJ (J is an integer) and then outputs the input address signals IA0 through IAJ at the internal core circuit 203. For convenience' sake of explanation, assume that the external address signals A0 and A1 are column address signals deciding on a logic value of the selection control signal S0SEB0 and the selection signals S0SEBR and S0SEBF.

In this case, the logic value of the selection control signal S0SEB0 and the selection signals S0SEBR and S0SEBF is decided according to the logic value of the column address signal A0 and A1. If the selection control signal S0SEB0 is once decided on, a logic value of the selection control signal S0SEB0 is maintained during 2 clock cycle and then toggled during next clock cycle.

In the sequential mode, logic values of the selection control signal S0SEB0 and A1 and the selection signals S0SEBR and S0SEBF according to logic value of the column address signals A0 are as in the following table 1.

TABLE 1

| A1 | A0 | Total bit value | SOSEB0 | SOSEBR | SOSEBF | Clock cycle |
|----|----|----|----|----|----|----|
| 0 | 0 | 0 | 0 | 0 | 0 | 1st CLK |
|    |    |   |   | 1 | 1 | 2nd CLK |
| 0 | 1 | 1 | 1 | 0 | 1 | 1st CLK |
|    |    |   |   | 1 | 0 | 2nd CLK |
| 1 | 0 | 2 | 0 | 1 | 1 | 1st CLK |
|    |    |   |   | 0 | 0 | 2nd CLK |
| 1 | 1 | 3 | 1 | 1 | 0 | 1st CLK |
|    |    |   |   | 0 | 1 | 2nd CLK |

Referring to the [table 1], when the column address signal A0 is logic '0', the selection control signal S0SEB0 is logic '0', and when the column address signal A0 is '1', the selection control signal S0SEB0 is logic '1'. When total bit value of the column address signals A1 and A0 is '0', the selection signals S0SEBR and S0SEBF respectively are logic '0' and then is toggled as logic '1'. When total bit value of the column address signals A1 and A0 is '1', the selection signal S0SEBR is logic '0' and then is toggled as logic '1' and the selection signal S0SEBF is logic '1' and then is toggled as logic '0'. In addition, when total bit value of the column address signals A1 and A0 is '2', the selection signals S0SEBR and S0SEBF respectively are logic '1' and then is toggled as logic '0'. When total bit value of the column address signals A1 and A0 is '3', the selection signal S0SEBR is logic '1' and then is toggled as logic '0' and the selection signal S0SEBF is logic '0' and then is toggled as logic '1'.

After that, when the input control signal PP1N is enabled, the selection signal generator 110 respectively outputs a plurality of input selection signals ISEL1 through ISEL4 in accordance with a logic value of the selection control signal SOSEB0.

When the selection control signal SOSEB0 is logic '0', the selection signal generator 110 outputs the input selection signals ISEL2 and ISEL3 as a low logic state, and the input selection signals ISEL1 and ISEL4 as a high logic state. As the result of the operation, a plurality of switches TG1, TG4, TG5 and TG8 of the input selection unit 130 are turned on and a plurality of switches TG2, TG3, TG6 and TG7 are turned off in response to the input selection signals ISEL1 through ISEL4. The input selection unit 130 respectively outputs pre-fetch data (EVD0, 0DD0, EVD1, 0DD1) at the internal data lines IDL0 through IDL4 as input selection data (PRERD0, PREFD0, PRERD1, PREFD1). Latch circuits 141 through 144 of the latch unit 140 respectively latch the input selection data (PRERD0, PREFD0, PRERD1, PREFD1) and then respectively output latch data LD0 through LD3. At this time, pre-fetch data respectively corresponding to the input selection data (PRERD0, PREFD0, PRERD1, PREFD1) latched by the latch circuits 141 through 144 are EVD0, 0DD0, EVD1, 0DD1 displayed as 'CASE1' in FIG. 6.

On the other hand, when the selection control signal SOSEB0 is logic '1', the selection signal generator 110 outputs the input selection signals ISEL2 and ISEL3 as a high logic state, and the input selection signals ISEL1 and ISEL4 as a low logic state. As the result of the operation, a plurality of switches TG1, TG4, TG5 and TG8 of the input selection unit 130 are turned off and a plurality of switches TG2, TG3, TG6 and TG7 are turned on in response to the input selection signals ISEL1 through ISEL4. The input selection unit 130 respectively outputs pre-fetch data (0DD0, EVD0, 0DD1, EVD1) at the internal data lines IDL0 through IDL4 as input selection data (PRERD0, PREFD0, PRERD1, PREFD1). A plurality of latch circuits 141 through 144 of the latch unit 140 respectively latch the input selection data (PRERD0, PREFD0, PRERD1, PREFD1) and then respectively output latch data LD0 through LD3. At this time, pre-fetch data respectively corresponding to the input selection data (PRERD0, PREFD0, PRERD1, PREFD1) latched by the latch circuits 141 through 144 are EVD0, 0DD0, EVD1, 0DD1 displayed as 'CASE2' in FIG. 6.

After that, the output selection unit 150 selects some of the latch data LD0 through LD3 in accordance with a logic value of the selection signals S0SEBR and S0SEBF and thus outputs the as pipe output data PRD0 and PFD0. For example, because the selection signals S0SEBR and S0SEBF respectively are logic '0' during a first clock cycle in the case that a logic value of the column address signals A1 and A0 is '00', the switches TG11 and TG13 of the output selection unit 150 are turned on and the switches TG12 and TG14 are turned off. As the result of the operation, the output selection unit 150 outputs the latch data LD0 (corresponding to pre-fetch data EVD0) as the output selection data PRD0, and the latch data LD1 (corresponding to pre-fetch data 0DD0) as the output selection data PFD0. After that, the output control signal POUTR is enabled and the output control signal POUTF is disabled in synchronism with (namely, in synchronism with a rising edge of an external clock signal CLK) a rising edge of a data strobe signal DQS. Accordingly, a pipe output circuit 161 of the pipe output unit 160 receives the output selection data PRD0 (corresponding to inverted pre-fetch data EVD0) in response to the output control signal POUTR, and then outputs a pipe output data RD0 (corresponding to pre-fetch data EVD0). Herein, the pipe output circuit 162 is disabled in response to the output control signal POUTF. In addition, the output control signal POUTR is disabled and the output control signal POUTF is enabled in synchronism with (namely, in synchronism with a falling edge of an external clock signal CLK) a falling edge of a data strobe signal DQS. Accordingly, a pipe output circuit 162 receives the output selection data PFD0 (corresponding to inverted pre-fetch data 0DD0) in response to the output control signal POUTF, and then outputs a pipe output data FD0 (corresponding to pre-fetch data 0DD0). Herein, the pipe output circuit 161 is disabled in response to the output control signal POUTR.

Because the selection signals S0SEBR and S0SEBF respectively are logic '1' during a second clock cycle in the case that a logic value of the column address signals A1 and A0 is '00', the switches TG12 and TG14 of the output selection unit 150 are turned on and the switches TG11 and TG13 are turned off. As the result of the operation, the output selection unit 150 outputs the latch data LD2 (corresponding to inverted pre-fetch data EVD1) as the output selection data PRD0, and the latch data LD3 (corresponding to inverted pre-fetch data 0DD1) as the output selection data PFD0. After that, the output control signal POUTR is enabled and the output control signal POUTF is disabled in synchronism with a rising edge of an external clock signal CLK. Accordingly, a pipe output circuit 161 of the pipe output unit 160 receives the output selection data PRD0 (corresponding to inverted pre-fetch data EVD1) in response to the output control signal POUTR, and then outputs a pipe output data RD0 (corresponding to pre-fetch data EVD01). Herein, the pipe output circuit 162 is disabled in response to the output control signal POUTF. In addition, the output control signal POUTR is disabled and the output control signal POUTF is enabled in synchronism with (namely, in synchronism with a falling edge of an external clock signal CLK) a falling edge of a data strobe signal DQS. Accordingly, a pipe output circuit 162 receives the output selection data PFD0 (corresponding to inverted pre-fetch data 0DD1) in response to the output control signal POUTF, and then outputs a pipe output data FD0 (corresponding to pre-fetch data 0DD1). Herein, the pipe output circuit 161 is disabled in response to the output control signal POUTR.

Finally, serial pipe output data is sequentially outputted in a specific order (namely, RD0, DF0, RD0, FD0 (EVD0, 0DD0, EVD1, 0DD1)) during two clock cycle of the external clock CLK. The output driver DRV0 outputs an output data 0DQ0 at a data input/output pin IOP0 in response to the pipe output data RD0 and FD0 (namely, corresponding to pre-fetch data (EVD0, 0DD0, EVD1, 0DD1)) sequentially received through the output node OUT0. Ultimately, when a logic value of the column address signals A1 and A0 is '00', the order of the output data 0DQ0 outputted by the output driver DRV0 is EVD0, 0DD0, EVD1, 0DD1 as displayed as 'CASE1' in FIG. 6. In FIG. 6, for a simplification of the drawing and an apprehension of the present invention, pre-fetch data (EVD0, 0DD0, EVD1, 0DD1) are respectively displayed as "D0, D1, D2, D3". Hereinafter, the pre-fetch data (EVD0, 0DD0, EVD1, 0DD1) are respectively referred to as "D0, D1, D2, D3".

When logic values of the column signals A1 and A0 are '01', the selection control signal S0SEB0 maintains a logic '1' during two clock cycle. At this time, the selection signal S0SEBR becomes logic '0' and the selection signal S0SEBF becomes logic '1' during a first clock cycle. After that, the selection signal S0SEBR becomes logic '1' and the selection signal S0SEBF becomes logic '0' during a second clock cycle. Therefore, serial pipe output data are sequentially outputted at the output node OUT0 in a specific order of RD0, FD0, RD0, FD0 (namely, D1, D2, D3, D0) like the detailed operation of the pipe latch circuit PLC0. Finally, when a logic value of the column address signals A1 and A0 is '01', the order of the output data 0DQ0 outputted by the output driver DRV0 is D1, D2, D3, D0 displayed as 'Q1' in FIG. 6.

When logic values of the column signals A1 and A0 are '10', the selection control signal S0SEB0 maintains a logic '0' during two clock cycle. At this time, the selection signals S0SEBR and the selection signal S0SEBF respectively become logic '1' during a first clock cycle. After that, the selection signals S0SEBR and the selection signal S0SEBF become logic '0' during a second clock cycle. Therefore, serial pipe output data are sequentially outputted at the output node OUT0 in a specific order of RD0, FD0, RD0, FD0 (namely, D2, D3, D0, D1) like the detailed operation of the pipe latch circuit PLC0. Finally, when a logic value of the column address signals A1 and A0 is '10', the order of the output data 0DQ0 outputted by the output driver DRV0 is D2, D3, D0, D1 displayed as 'Q2' in FIG. 6.

When logic values of the column signals A1 and A0 are '11', the selection control signal S0SEB0 maintains a logic '1' during two clock cycle. At this time, the selection signal S0SEBR becomes logic '1' and the selection signal S0SEBF becomes logic '0' during a first clock cycle. After that, the selection signal S0SEBR becomes logic '0' and the selection signal S0SEBF becomes logic '1' during a second clock cycle. Therefore, serial pipe output data are sequentially outputted at the output node OUT0 in a specific order of RD0, FD0, RD0, FD0 (namely, D3, D0, D1, D2) like the detailed operation of the pipe latch circuit PLC0. Finally, when a logic value of the column address signals A1 and A0 is '11', the order of the output data 0DQ0 outputted by the output driver DRV0 is D3, D0, D1, D2 displayed as 'Q3' in FIG. 6.

Next, the following is the READ operation of the semiconductor memory device 200 in the case that the pipe latch circuit PLC0 is operated as the interleave mode.

The pipe latch circuit PLC0 is operated alike in case of the interleave mode and the sequential mode For the simplification of explanation, the difference between the interleave mode and the sequential mode will mainly be mentioned hereinafter.

At first, in the interleave mode, logic values of the selection control signal S0SEB0 and A1 and the selection signals S0SEBR and S0SEBF according to logic value of the column address signals A0 are as in the following table 2.

TABLE 1

| A1 | A0 | Total bit value | SOSEB0 | SOSEBR | SOSEBF | Clock cycle |
|----|----|-----|--------|--------|--------|-------------|
| 0 | 0 | 0 | 0 | 0 | 0 | 1st CLK |
|   |   |   |   | 1 | 1 | 2nd CLK |
| 0 | 1 | 1 | 1 | 0 | 0 | 1st CLK |
|   |   |   |   | 1 | 1 | 2nd CLK |
| 1 | 0 | 2 | 0 | 1 | 1 | 1st CLK |
|   |   |   |   | 0 | 0 | 2nd CLK |
| 1 | 1 | 3 | 1 | 1 | 1 | 1st CLK |
|   |   |   |   | 0 | 1 | 2nd CLK |

When logic values of the column signals A1 and A0 are '00', the selection control signal S0SEB0 maintains a logic '0' during two clock cycle. At this time, the selection signals S0SEBR and the selection signal S0SEBF respectively become logic '0' during a first clock cycle. After that, the selection signals S0SEBR and the selection signal S0SEBF become logic '1' during a second clock cycle. Therefore, serial pipe output data are sequentially outputted at the output node OUT0 in an order of RD0, FD0, RD0, FD0 (namely, D0, D1, D2, D3) like the detailed operation of the pipe latch circuit PLC0. Finally, when a logic value of the column address signals A1 and A0 is '00', the order of the output data 0DQ0 outputted by the output driver DRV0 is D0, D1, D2, D3 displayed as 'Q0' in FIG. 6.

When logic values of the column signals A1 and A0 are '01', the selection control signal S0SEB0 maintains a logic '1' during two clock cycle. At this time, the selection signals S0SEBR and the selection signal S0SEBF respectively become logic '0' during a first clock cycle. After that, the selection signals S0SEBR and the selection signal S0SEBF become logic '1' during a second clock cycle. Therefore, serial pipe output data are sequentially outputted at the output node OUT0 in an order of RD0, FD0, RD0, FD0 (namely, D1, D0, D3, D2) like the detailed operation of the pipe latch circuit PLC0. Finally, when a logic value of the column address signals A1 and A0 is '01', the order of the output data 0DQ0 outputted by the output driver DRV0 is D1, D0, D3, D2 displayed as 'Q1' in FIG. 6.

When logic values of the column signals A1 and A0 are '10', the selection control signal S0SEB0 maintains a logic '0' during two clock cycle. At this time, the selection signals S0SEBR and the selection signal S0SEBF respectively become logic '1' during a first clock cycle. After that, the selection signals S0SEBR and the selection signal S0SEBF become logic '0' during a second clock cycle. Therefore, serial pipe output data are sequentially outputted at the output node OUT0 in an order of RD0, FD0, RD0, FD0 (namely, D2, D3, D0, D1) like the detailed operation of the pipe latch circuit PLC0. Finally, when a logic value of the column address signals A1 and A0 is '10', the order of the output data 0DQ0 outputted by the output driver DRV0 is D2, D3, D0, D1 displayed as 'Q2' in FIG. 6.

When logic values of the column signals A1 and A0 are '11', the selection control signal S0SEB0 maintains a logic '1' during two clock cycle. At this time, the selection signals S0SEBR and the selection signal S0SEBF respectively become logic '1' during a first clock cycle. After that, the selection signals S0SEBR and the selection signal S0SEBF become logic '0' during a second clock cycle. Therefore, serial pipe output data are sequentially outputted at the output node OUT0 in an order of RD0, FD0, RD0, FD0 (namely, D3, D2, D1, D0) like the detailed operation of the pipe latch circuit PLC0. Finally, when a logic value of the column address signals A1 and A0 is '11', the order of the output data 0DQ0 outputted by the output driver DRV0 is D3, D2, D1, D0 displayed as 'Q3' in FIG. 6.

Figure 7:
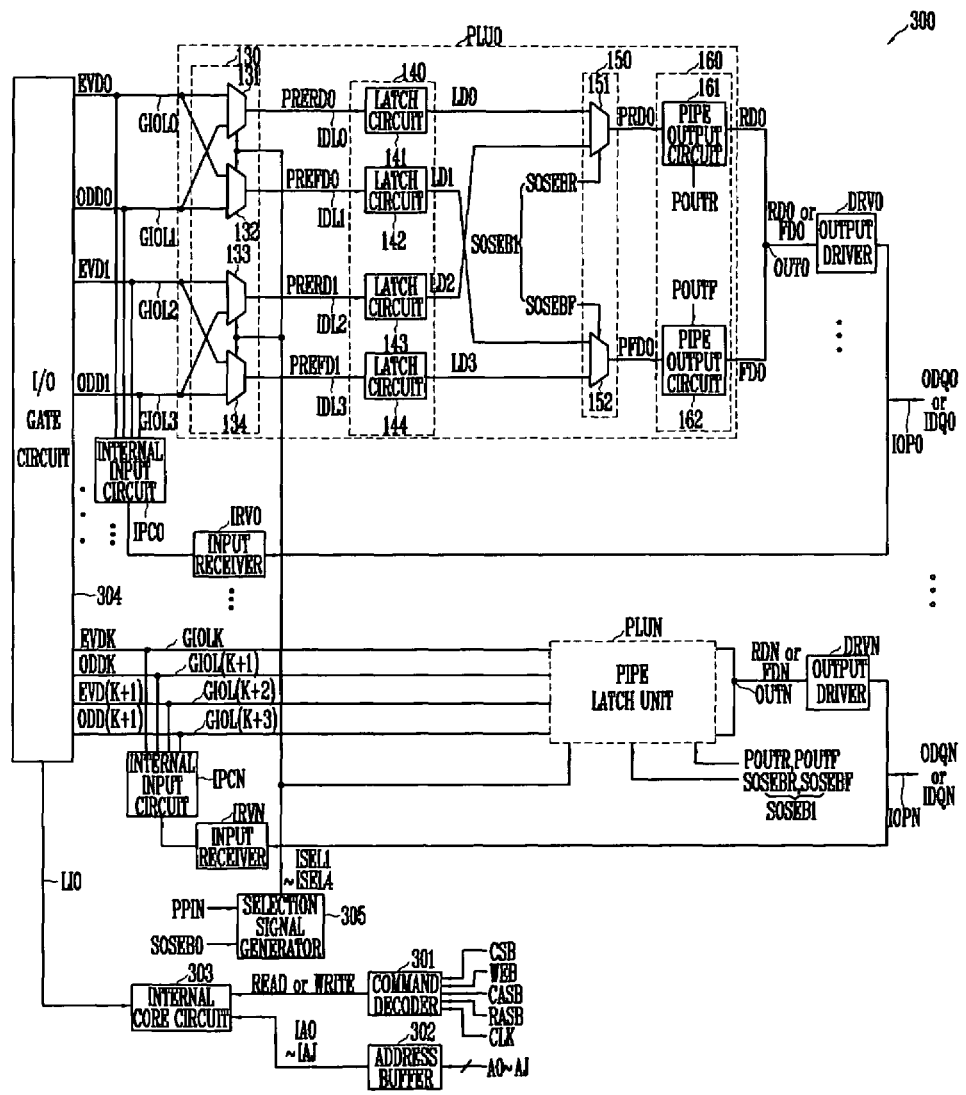
FIG. 7 is a schematic block diagram showing a semiconductor memory device in accordance with an exemplary embodiment of the present invention.

FIG. 7 is a schematic block diagram showing a semiconductor memory device in accordance with another exemplary embodiment of the present invention.

Referred to FIG. 7, the semiconductor memory device 300 include a command decoder 301, an address buffer 302, an internal core circuit 303, an input/output gate circuit 304, a selection signal generator 305, pipe latches PLU0 through PLUN (P is an integer), output drivers DRV0 through DRVN, input receivers IRV0 through IRVN and internal input circuits IPC0 through IPCN. A structure and specific operation of the semiconductor memory device 300 are similar to ones of the semiconductor memory device 200 mentioned in FIG. 5. Therefore, for avoiding the duplication of explanation, the difference between the semiconductor memory device 200 and the semiconductor memory device 300 will be mainly explained hereinafter.

The difference is that the semiconductor memory device 300 includes one selection signal generator 305. Accordingly, the pipe latches PLU0 through PLUN are operated in response to input selection signals ISEL1 through ISEL4 generated by the selection signal generator 305.

As described above, a pipe latch circuit for increasing data output speed, a semiconductor memory device with the pipe latch circuit and data output operation method of the same in accordance with the present invention are capable of increasing data output speed by reducing an output path of pre-fetch data delivered at GIO lines and thus reducing the change of voltage level of the pre-fetch data.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims.

What is claimed is:

1. A pipe latch circuit in a semiconductor memory device comprising:
   a selection signal generator for generating an input selection signal in response to an input control signal and a first selection control signal; and
   a pipe latch unit for inverting pre-fetch data received in parallel through a plurality of GIO (Global Input and Output) lines into serial pipe output data in response to the input selection signals, a second selection signal and an output control signals and then outputting them to an output node,
   wherein the pipe latch unit includes an input selection unit for selectively changing the parallel order of the pre-fetches respectively received through the GIO lines in response to the input selection signals and then respectively outputting input selection data to a plurality of internal data lines in accordance with the change result.

2. The pipe latch circuit as claimed in claim 1, wherein the output node is connected to an output driver for outputting serial output data to an external unit through a data input/output pin in response to the serial pipe output data.

3. The pipe latch circuit as claimed in claim 1, wherein the selection signal generator generates the input selection signal on the basis of a logic value of the first selection control signal in the event that the input control signal is enabled, and maintains some of the input selection signals as a first logic level and the others of the input selection signals as a second logic level irrespective of a logic value of the first selection signal in the event that the input control signal is disabled.

4. The pipe latch circuit as claimed in claim 3, wherein the pipe latch unit stops an output action of the pipe output data in the event that some of the input selection signals are maintained as a first logic level and the others of the input selection signals are maintained as the second logic level.

5. The pipe latch circuit as claimed in claim 1, wherein the input selection signals include a first through second input selection signals, and the input signal generator includes a first logic circuit for outputting the first input selection signal in response to the input control signal and the first selection control signal, a second logic circuit for outputting a third input selection signal in response to an inverted signal of the first selection control signal and the input control signal, a third logic circuit for outputting a second input selection signal based on the first input selection signal, and a fourth logic circuit for outputting a fourth input selection signal based on the third input selection signal.

6. The pipe latch circuit as claimed in claim 5, wherein the first logic circuit includes a first NAND gate for receiving the input control signal and the first selection control signal and outputting the first input selection signal, and the second logic circuit includes a second NAND gate for receiving an inverted signal of the first selection control and the input control signal and outputting the third input selection signal.

7. The pipe latch circuit as claimed in claim 5, wherein the third logic circuit includes a first inverter for inverting the first input selection signal and outputting the inverted signal as the second selection signal, and the fourth logic circuit includes a second inverter for inverting the third input selection signal and outputting the inverted signal as the fourth selection signal.

8. The pipe latch circuit as claimed in claim 1, wherein the pipe latch unit further comprises:
 a latch unit for latching the input selection data received from the input selection unit through the internal data lines and outputting latch data;
 an output selection unit for selecting some of the latch data and outputting output selection data in response to the second selection control signal; and
 a pipe output unit for outputting the serial pipe output data based on the output selection data at the output node in response to the output control signals.

9. The pipe latch circuit as claimed in claim 1, wherein the GIO lines include a first through fourth GIO lines, the pre-fetch data include a first through fourth pre-fetch data transmitted at the input selection unit through the first through fourth GIO lines, the input selection data include a first through fourth input selection data, the input selection unit includes a first selection circuit for selecting one of the first through second pre-fetch data and then outputting the first input selection data, a second selection circuit for selecting one of the first through second pre-fetch data and then outputting the second input selection data, a third selection circuit for selecting one of the third through fourth pre-fetch data and then outputting the third input selection data, and a fourth selection circuit for selecting one of the third through fourth pre-fetch data and then outputting the fourth input selection data, wherein the first through fourth selection circuits respectively select separate pre-fetches.

10. The pipe latch circuit as claimed in claim 9, wherein the input selection signals include a first through fourth input selection signals, and the first through fourth selection circuits respectively include a multiplexer actuated in response to the first through fourth input selection signals.

11. The pipe latch circuit as claimed in claim 9, wherein the input selection signals include a first through fourth input selection signals, and the internal data lines include a first through fourth internal data lines, the first selection circuit includes a first switch for being connected between the first GIO line and the first internal data line and being turned on or turned off in response to the third and fourth input selection signals and a second switch for being connected between the second GIO line and the first internal data line and being turned on or turned off in response to the first and second input selection signals, the second selection circuit includes a third switch for being connected between the first GIO line and the second internal data line and being turned on or turned off in response to the first and second input selection signals, and a fourth switch for being connected between the second GIO line and the second internal data line and being turned on or turned off in response to the third and fourth input selection signals.

12. The pipe latch circuit as claimed in claim 11, wherein the second and third switches are turned off in the event that the first and fourth switches are turned on, and the first through fourth switches are turned off in the event that the second and third switches are turned on, wherein the first through fourth switches respectively include a transmission gate.

13. The pipe latch circuit as claimed in claim 9, wherein the input selection signals include a first through fourth input selection signals, and the internal data lines include a first through fourth internal data lines, the third selection circuit includes a first switch for being connected between the third GIO line and the third internal data line and being turned on or turned off in response to the third and fourth input selection signals and a second switch for being connected between the fourth GIO line and the third internal data line and being turned on or turned off in response to the first and second input selection signals, and the fourth selection circuit includes a third switch for being connected between the third GIO line and the fourth internal data line and being turned on or turned off in response to the first and second input selection signals, and a fourth switch for being connected between the fourth GIO line and the fourth internal data line and being turned on or turned off in response to the third and fourth input selection signals.

14. The pipe latch circuit as claimed in claim 13, wherein the second and third switches are turned off in the event that the first and fourth switches are turned on, and the first through fourth switches are turned off in the event that the second and third switches are turned on, wherein the first through fourth switches respectively include a transmission gate.

15. The pipe latch circuit as claimed in claim 8, wherein the latch unit includes a plurality of latch circuits for respectively being connected to the internal data lines and respectively latching the selection data.

16. The pipe latch circuit as claimed in claim 9, wherein the pipe latch unit further comprises:
   a latch unit for latching the input selection data received from the input selection unit through the internal data lines and outputting latch data;
   an output selection unit for selecting some of the latch data and outputting output selection data in response to the second selection control signal; and
   a pipe output unit for outputting the serial pipe output data based on the output selection data at the output node in response to the output control signals.

17. The pipe latch circuit as claimed in claim 16, wherein the internal data lines include a first through fourth internal data lines, the latch data include a first through fourth latch data, the latch unit includes a first latch circuit for latching the first input selection data received through the first internal data line and outputting the first latch data, a second latch circuit for latching the second input selection data received through the second internal data line and outputting the second latch data, a third latch circuit for latching the third input selection data received through the third internal data line and outputting the third latch data, and a fourth latch circuit for latching the fourth input selection data received through the fourth internal data line and outputting the fourth latch data.

18. The pipe latch circuit as claimed in claim 17, wherein the second selection control signals include a first and second selection signals, the output selection data include the first and second output selection data, and the output selection unit includes a fifth selection circuits for selecting one of the first and second latch data and then outputting the first selection data in response to the first selection signal, and a sixth selection circuit for selecting one of the third and fourth latch data and then outputting the second selection data in response to the second selection signal.

19. The pipe latch circuit as claimed in claim 18, wherein the output control signals include a first and second output control signals, and the pipe output unit includes a first pipe output circuit for receiving the first output selection data in response to the first output control signal and then outputting one of the pipe output data at output node in response to the first output selection data, and a second pipe output circuit for receiving the second output selection data in response to the second output control signal and then outputting another one of the pipe output data at output node in response to the second output selection data.

20. The pipe latch circuit as claimed in claim 19, wherein the first and the second pipe output circuits is alternately actuated until the parallel first through fourth pre-fetch data are all outputted at the output node as the serial pipe output data.

21. The pipe latch circuit as claimed in claim 19, wherein the fifth selection circuit includes a first inverter for inverting the first selection signal and then outputting the inverted first selection signal, a first switch for being connected between an output terminal of the first latch circuit and an input terminal of the first pipe output circuit and being turned on or turned off in response to the first selection signal and the inverted first selection signal and a second switch for being connected between an output terminal of the third latch circuit and an input terminal of the first pipe output circuit and being turned on or turned off in response to the first selection signal and the inverted first selection signal, and the sixth selection circuit includes a second inverter for inverting the second selection signal and then outputting the inverted second selection signal, a third switch for being connected between an output terminal of the second latch circuit and an input terminal of the second pipe output circuit and being turned on or turned off in response to the second selection signal and the inverted second selection signal, and a fourth switch for being connected between an output terminal of the fourth latch circuit and an input terminal of the second pipe output circuit and being turned on or turned off in response to the second selection signal and the inverted second selection signal.

22. The pipe latch circuit as claimed in claim 21, wherein the first through fourth switches respectively include a transmission gate.

23. A semiconductor memory device comprising:
   a plurality of pipe latch circuits for forming an output path of a plurality of pre-fetches respectively received through a plurality of GIO lines in case of the READ operation of the semiconductor memory device; and
   a plurality of output drivers for respectively forming a data output path between the pipe latch circuits and a plurality of input/output pins,
   wherein the pipe latch circuits respectively include a selection signal generator for generating an input selection signal in response to an input control signal and a first selection control signal and a pipe latch unit for inverting the pre-assigned number of pre-fetch data of the pre-fetch data respectively received in parallel through the pre-assigned number of GIO lines of the GIO lines into a serial pipe output data in response to the input selection signals and then outputting the serial pipe output data at one of the output drivers through an output node, a second selection control signal and an output control signal, wherein the pipe latch unit includes an input selection unit for selectively changing a parallel order of the pre-assigned number of pre-fetch data respectively received through the pre-assigned number of GIO lines in response to the input selection signals and then respectively outputting input selection data at the pre-assigned number of internal data lines in accordance with the change result.

24. The semiconductor memory device as claimed in claim 23, further comprising:
   an internal core circuit for including a memory cell array and its peripheral circuits;
   a command decoder for outputting a read or write command at the internal core circuit in response to external control signals and an external clock signal;
   an address buffer for receiving an external address signal and then outputting input address signals at the internal core circuit; and
   an input/output gate circuit for being connected between the GIO lines and a plurality of LIO (Local Input and Output) lines and thus respectively outputting the pre-fetch data respectively received through the LIO lines at the GIO lines in case of the READ operation.

25. The semiconductor memory device as claimed in claim 24, further comprising:
   a plurality of input receivers for receiving a plurality of input data through the data input/output pins in case of the WRITE operation of the semiconductor memory device; and
   a plurality internal circuits for respectively inverting the input data respectively received from the input receivers into parallel internal data and then respectively outputting them at the GIO lines,
   wherein the input/output gate circuit for respectively outputting the internal input data respectively received through the GIO lines at the LIO lines in case of the WRITE operation.

26. The semiconductor memory device as claimed in claim 23, wherein the selection signal generator generates the input selection signal on the basis of a logic value of the first selection control signal in the event that the input control signal is enabled, and maintains some of the input selection signals as a first logic level and the others of the input selection signals as a second logic level irrespective of a logic value of the first selection signal in the event that the input control signal is disabled.

27. The semiconductor memory device as claimed in claim 26, wherein the pipe latch unit stops an output action of the pipe output data in the event that some of the input selection signals are maintained as a first logic level and the others of the input selection signals are maintained as the second logic level.

28. The semiconductor memory device as claimed in claim 23, wherein the input selection signals include a first and fourth input selection signals, and the selection signal generator includes a first inverter for inverting the first selection control signal and outputting the inverted first input selection signal, a first NAND gate for outputting the third input selection signal in response to the input control signal and the first selection control signal, a second NAND gate for outputting the third input selection signal in response to the inverted first selection control signal and the input control signal, and a third inverter for inverting the third input selection signal and outputting the inverted signal as the fourth input selection signal.

29. The semiconductor memory device as claimed in claim 23, wherein the pre-assigned number of GIO lines include a first through fourth GIO lines, the pre-assigned number of pre-fetch data include a first through fourth pre-fetch data respectively transmitted at the input selection unit through the first through fourth GIO lines, the input selection data include a first through fourth input selection data, the input selection unit includes a first selection circuit for selecting one of the first through second pre-fetch data and then outputting the first input selection data, a second selection circuit for selecting one of the first through second pre-fetch data and then outputting the second input selection data, a third selection circuit for selecting one of the third through fourth pre-fetch data and then outputting the third input selection data, and a fourth selection circuit for selecting one of the third through fourth pre-fetch data and then outputting the fourth input selection data, wherein the first through fourth selection circuits respectively select separate pre-fetch data.

30. The semiconductor memory device as claimed in claim 29, wherein the input selection signals include a first through fourth input selection signals, and the pre-assigned number of internal data lines include a first through fourth internal data lines, the first selection circuit includes a first switch for being connected between the first GIO line and the first internal data line and being turned on or turned off in response to the third and fourth input selection signals and a second switch for being connected between the second GIO line and the first internal data line and being turned on or turned off in response to the first and second input selection signals, the second selection circuit includes a third switch for being connected between the first GIO line and the second internal data line and being turned on or turned off in response to the first and second input selection signals, and a fourth switch for being connected between the second GIO line and the second internal data line and being turned on or turned off in response to the third and fourth input selection signals.

31. The semiconductor memory device as claimed in claim 30, wherein the second and third switches are turned off in the event that the first and fourth switches are turned on, and the first through fourth switches are turned off in the event that the second and third switches are turned on, wherein the first through fourth switches respectively include a transmission gate.

32. The semiconductor memory device as claimed in claim 29, wherein the input selection signals include a first through fourth input selection signals, and the pre-assigned number of internal data lines include a first through fourth internal data lines, the third selection circuit includes a first switch for being connected between the third GIO line and the third internal data line and being turned on or turned off in response to the third and fourth input selection signals and a second switch for being connected between the fourth GIO line and the third internal data line and being turned on or turned off in response to the first and second input selection signals, and the fourth selection circuit includes a third switch for being connected between the third GIO line and the fourth internal data line and being turned on or turned off in response to the first and second input selection signals, and a fourth switch for being connected between the fourth GIO line and the fourth internal data line and being turned on or turned off in response to the third and fourth input selection signals.

33. The semiconductor memory device as claimed in claim 32, wherein the second and third switches are turned off in the event that the first and fourth switches are turned on, and the first through fourth switches are turned off in the event that the second and third switches are turned on, wherein the first through fourth switches respectively include a transmission gate.

34. The semiconductor memory device as claimed in claim 29, wherein the pipe latch unit further comprises:
a latch unit for latching the input selection data received from the input selection unit through the pre-assigned number of internal data lines and outputting latch data;
an output selection unit for selecting some of the latch data and outputting output selection data in response to the second selection control signal; and
a pipe output unit for outputting the serial pipe output data based on the output selection data at the output node in response to the output control signals.

35. The semiconductor memory device as claimed in claim 34, wherein the pre-assigned number of internal data lines include a first through fourth internal data lines, the latch data include a first through fourth latch data, the latch unit includes a first latch circuit for latching the first input selection data received through the first internal data line and outputting the first latch data, a second latch circuit for latching the second input selection data received through the second internal data line and outputting the second latch data, a third latch circuit for latching the third input selection data received through the third internal data line and outputting the third latch data, and a fourth latch circuit for latching the fourth input selection data received through the fourth internal data line and outputting the fourth latch data.

36. The semiconductor memory device as claimed in claim 35, wherein the second selection control signals include a first and second selection signals, the output selection data include the first and second output selection data, and the output selection unit includes a fifth selection circuits for selecting one of the first and second latch data and then outputting the first selection data in response to the first selection signal, and a sixth selection circuit for selecting one of the third and fourth latch data and then outputting the second selection data in response to the second selection signal.

37. The semiconductor memory device as claimed in claim 36, wherein the output control signals include a first and second output control signals, and the pipe output unit includes a first pipe output circuit for receiving the first output selection data in response to the first output control signal and then outputting one of the pipe output data at output node in response to the first output selection data, and a second pipe output circuit for receiving the second output selection data in response to the second output control signal and then outputting another one of the pipe output data at output node in response to the second output selection data.

38. The semiconductor memory device as claimed in claim 37, wherein the first and the second pipe output circuits is alternately actuated until the parallel first through fourth pre-fetch data are all outputted at the output node as the serial pipe output data.

39. The semiconductor memory device as claimed in claim 37, wherein the fifth selection circuit includes a first inverter for inverting the first selection signal and then outputting the inverted first selection signal, a first switch for being connected between an output terminal of the first latch circuit and an input terminal of the first pipe output circuit and being turned on or turned off in response to the first selection signal and the inverted first selection signal and a second switch for being connected between an output terminal of the third latch circuit and an input terminal of the first pipe output circuit and being turned on or turned off in response to the first selection signal and the inverted first selection signal, and the sixth selection circuit includes a second inverter for inverting the second selection signal and then outputting the inverted second selection signal, a third switch for being connected between an output terminal of the second latch circuit and an input terminal of the second pipe output circuit and being turned on or turned off in response to the second selection signal and the inverted second selection signal, and a fourth switch for being connected between an output terminal of the fourth latch circuit and an input terminal of the second pipe output circuit and being turned on or turned off in response to the second selection signal and the inverted second selection signal.

40. A semiconductor memory device comprising:
 a selection signal generator for generating an input selection signal in response to an input control signal and a first selection control signal;
 a plurality of pipe latch units for forming an output path of a plurality of pre-fetch data respectively received through a plurality of GIO lines in response to the input selection signals, a second selection control signal and output control signals in case of the READ operation of the semiconductor memory device; and
 a plurality of output drivers for respectively forming a data output path between the pipe latch units and a plurality of input/output pins,
 wherein the pipe latch units respectively inverts the pre-assigned number of pre-fetch data of the pre-fetch data respectively received in parallel through the pre-assigned number of GIO lines of the GIO lines into a serial pipe output data and then outputting the serial pipe output data at one of the output drivers through an output node, and include an input selection unit for selectively changing a parallel order of the pre-assigned number of pre-fetch data respectively received through the pre-assigned number of GIO lines in response to the input selection signals and then respectively outputting input selection data at the pre-assigned number of internal data lines in accordance with the change result.

41. The semiconductor memory device as claimed in claim 40, further comprising:
 an internal core circuit for including a memory cell array and its peripheral circuits;
 a command decoder for outputting a read or write command at the internal core circuit in response to external control signals and an external clock signal;
 an address buffer for receiving an external address signal and then outputting input address signals at the internal core circuit; and
 an input/output gate circuit for being connected between the GIO lines and a plurality of LIO (Local Input and Output) lines and thus respectively outputting the pre-fetch data respectively received through the LIO lines at the GIO lines in case of the READ operation.

42. The semiconductor memory device as claimed in claim 41, further comprising:
 a plurality of input receivers for receiving a plurality of input data through the data input/output pins in case of the WRITE operation of the semiconductor memory device; and
 a plurality internal circuits for respectively inverting the input data respectively received from the input receivers into parallel internal data and then respectively outputting them at the GIO lines,
 wherein the input/output gate circuit for respectively outputting the internal input data respectively received through the GIO lines at the LIO lines in case of the WRITE operation.

43. The semiconductor memory device as claimed in claim 40, wherein the selection signal generator generates the input selection signal on the basis of a logic value of the first selection control signal in the event that the input control signal is enabled, and maintains some of the input selection signals as a first logic level and the others of the input selection signals as a second logic level irrespective of a logic value of the first selection signal in the event that the input control signal is disabled.

44. The semiconductor memory device as claimed in claim 43, wherein the pipe latch unit stops an output action of the pipe output data in the event that some of the input selection signals are maintained as a first logic level and the others of the input selection signals are maintained as the second logic level.

45. The semiconductor memory device as claimed in claim 40, wherein the input selection signals include a first and fourth input selection signals, and the selection signal generator includes a first inverter for inverting the first selection control signal and outputting the inverted first input selection signal, a first NAND gate for outputting the third input selection signal in response to the input control signal and the first selection control signal, a second NAND gate for outputting the third input selection signal in response to the inverted first selection control signal and the input control signal, and a third inverter for inverting the third input selection signal and outputting the inverted signal as the fourth input selection signal.

46. The semiconductor memory device as claimed in claim 40, wherein the pre-assigned number of GIO lines include a first through fourth GIO lines, the pre-assigned number of pre-fetch data include a first through fourth pre-fetch data respectively transmitted at the input selection unit through the first through fourth GIO lines, the input selection data include a first through fourth input selection data, the input selection unit includes a first selection circuit for selecting one of the first through second pre-fetch data and then outputting the first input selection data, a second selection circuit for selecting one of the first through second pre-fetch data and then outputting the second input selection data, a third selection circuit for selecting one of the third through fourth pre-fetch data and then outputting the third input selection data, and a fourth selection circuit for selecting one of the third through fourth pre-fetch data and then outputting the fourth input selection data, wherein the first through fourth selection circuits respectively select separate pre-fetches.

47. The semiconductor memory device as claimed in claim 46, wherein the input selection signals include a first through fourth input selection signals, and the pre-assigned number of internal data lines include a first through fourth internal data lines, the first selection circuit includes a first switch for being connected between the first GIO line and the first internal data line and being turned on or turned off in response to the third and fourth input selection signals and a second switch for being connected between the second GIO line and the first internal data line and being turned on or turned off in response to the first and second input selection signals, the second selection circuit includes a third switch for being connected between the first GIO line and the second internal data line and being turned on or turned off in response to the first and second input selection signals, and a fourth switch for being connected between the second GIO line and the second internal data line and being turned on or turned off in response to the third and fourth input selection signals.

48. The semiconductor memory device as claimed in claim 47, wherein the second and third switches are turned off in the event that the first and fourth switches are turned on, and the first through fourth switches are turned off in the event that the second and third switches are turned on, wherein the first through fourth switches respectively include a transmission gate.

49. The semiconductor memory device as claimed in claim 46, wherein the input selection signals include a first through fourth input selection signals, and the pre-assigned number of internal data lines include a first through fourth internal data lines, the third selection circuit includes a first switch for being connected between the third GIO line and the third internal data line and being turned on or turned off in response to the third and fourth input selection signals and a second switch for being connected between the fourth GIO line and the third internal data line and being turned on or turned off in response to the first and second input selection signals, and the fourth selection circuit includes a third switch for being connected between the third GIO line and the fourth internal data line and being turned on or turned off in response to the first and second input selection signals, and a fourth switch for being connected between the fourth GIO line and the fourth internal data line and being turned on or turned off in response to the third and fourth input selection signals.

50. The semiconductor memory device as claimed in claim 49, wherein the second and third switches are turned off in the event that the first and fourth switches are turned on, and the first through fourth switches are turned off in the event that the second and third switches are turned on, wherein the first through fourth switches respectively include a transmission gate.

51. The semiconductor memory device as claimed in claim 46, further comprising:
a latch unit for latching the input selection data received from the input selection unit through the pre-assigned number of internal data lines and outputting latch data;
an output selection unit for selecting some of the latch data and outputting output selection data in response to the second selection control signal; and
a pipe output unit for outputting the serial pipe output data based on the output selection data at the output node in response to the output control signals.

52. The semiconductor memory device as claimed in claim 51, wherein the pre-assigned number of internal data lines include a first through fourth internal data lines, the latch data include a first through fourth latch data, the latch unit includes a first latch circuit for latching the first input selection data received through the first internal data line and outputting the first latch data, a second latch circuit for latching the second input selection data received through the second internal data line and outputting the second latch data, a third latch circuit for latching the third input selection data received through the third internal data line and outputting the third latch data, and a fourth latch circuit for latching the fourth input selection data received through the fourth internal data line and outputting the fourth latch data.

53. The semiconductor memory device as claimed in claim 52, wherein the second selection control signals include a first and second selection signals, the output selection data include the first and second output selection data, and the output selection unit includes a fifth selection circuits for selecting one of the first and second latch data and then outputting the first selection data in response to the first selection signal, and a sixth selection circuit for selecting one of the third and fourth latch data and then outputting the second selection data in response to the second selection signal.

54. The semiconductor memory device as claimed in claim 53, wherein the output control signals include a first and second output control signals, and the pipe output unit includes a first pipe output circuit for receiving the first output selection data in response to the first output control signal and then outputting one of the pipe output data at output node in response to the first output selection data, and a second pipe output circuit for receiving the second output selection data in response to the second output control signal and then outputting another one of the pipe output data at output node in response to the second output selection data.

55. The semiconductor memory device as claimed in claim 54, wherein the first and the second pipe output circuits is alternately actuated until the parallel first through fourth pre-fetch data are all outputted at the output node as the serial pipe output data.

56. A data output operation method of a pipe latch circuit included in a semiconductor memory device, the method comprising the steps of:
generating input selection signals in response to an input control signal and a first selection control signal;
selectively changing the parallel order of the pre-fetches respectively received through the GIO lines in response to the input selection signals and then respectively outputting input selection data to a plurality of internal data lines in accordance with the change result;
latching the input selection data and then outputting latch data;
selecting some of the latch data in response to a second selection control signal and then outputting output selection data; and
outputting serial pipe output data based on the output selection data at an output driver through an output node in response to output control signal.

57. The method as claimed in claim 56, wherein the input selection signals include a first through fourth input selection signals and the generating step of the input selection signal includes the sub-steps of inverting the first selection control signal and then outputting the inverted first selection control signal, logic-operating the input control and the first selection control signal and then outputting the third input selection signal;
inverting the first input selection signal and then outputting the inverted signal as the second input selection signal; and inverting the third input selection signal and then outputting the inverted signal as the fourth input selection signal, wherein, in the event that any one of the first through third input selection signals is enabled, another one is disabled.

58. The method as claimed in claim 56, wherein the pre-fetch data include a first through fourth pre-fetch data and the input selection data include a first through fourth input selection data, wherein the outputting step of the input selection data includes the sub-steps of selecting one of the first and second pre-fetch data in response to the input selection control signal and then outputting the selected data as the first input selection data, selecting one of the first and second pre-fetch data in response to the input selection control signal and then outputting the selected data as the second input selection data, selecting one of the third and fourth pre-fetch data in response to the input selection control signal and then outputting the selected data as the third input selection data, and selecting one of the third and fourth pre-fetch data in response to the input selection control signal and then outputting the selected data as the fourth input selection data.

* * * * *